United States Patent
Chang et al.

(10) Patent No.: US 7,026,171 B2
(45) Date of Patent: Apr. 11, 2006

(54) RAPID THERMAL ANNEALING PROCESS

(75) Inventors: Y. Y. Chang, Hsinchu (TW); Shih-Liang Chou, Hsinchu (TW); L. H. Lee, Hsinchu (TW); Tsung-De Lin, Hsinchu (TW); Kou-Yow Tseng, Hsinchu (TW); Wen-Cheng Lien, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 218 days.

(21) Appl. No.: 10/604,246

(22) Filed: Jul. 4, 2003

(65) Prior Publication Data

US 2004/0224538 A1 Nov. 11, 2004

(51) Int. Cl.
*H01L 21/00* (2006.01)
*H01L 21/66* (2006.01)

(52) U.S. Cl. .............................. 438/7; 438/10; 438/11; 438/16; 438/17; 438/18

(58) Field of Classification Search .................. 438/16, 438/17, 18, 530
See application file for complete search history.

(56) References Cited

U.S. PATENT DOCUMENTS 5,831,249 A * 11/1998 Rohner et al. .............. 219/413
6,521,496 B1 * 2/2003 Roy et al. ................... 438/261

* cited by examiner

*Primary Examiner*—Craig A. Thompson
*Assistant Examiner*—David L. Hogans
(74) *Attorney, Agent, or Firm*—Jianq Chyun IP Office

(57) ABSTRACT

A rapid thermal annealing ("RTA") process providing for an RTA equipment is disclosed. The RTA equipment has a pyrometer providing for measuring an operation parameter, e.g., a temperature of the RTA process. The RTA process comprises steps of proceeding a first RTA step to a wafer in the RTA equipment, then comparing a measured value of the operation parameter with a reference range of value of the operation parameter, thereafter proceeding a second RTA step to the wafer in the RTA equipment when the measured value of the operation parameter is in between the reference range of value of the operation parameter. When the measured value of the operation parameter is out of the reference range of value of the operation parameter, the RTA equipment is turned off, and the wafer is unloaded from the RTA equipment and loaded into another RTA equipment to complete the RTA process.

6 Claims, 3 Drawing Sheets

RAPID THERMAL ANNEALING PROCESS

BACKGROUND OF INVENTION

1. Field of the Invention

The present invention generally relates to a thermal process of a semiconductor process. More particularly, the present invention relates to a rapid thermal annealing ("RTA") process of a semiconductor process for monitoring the stability of the RTA process to avoid a failure of wafer.

2. Description of the Related Art

In a semiconductor process, a conventional thermal process includes, for example, annealing after ion implant, solidification, development or annealing of an gate oxide layer, forming reaction of a metal-silicon material, thermal flow or thermal reflow of a borophosphosilicate glass ("BPSG"). A method of performing the conventional thermal process described above includes, for example, using a furnace or a rapid thermal annealing ("RTA") process. Moreover, compared with the thermal process of using a furnace, the RTA process can complete a thermal process in a relatively short time. Therefore a thermal budget of the RTA process is substantially low and is suitable for a semiconductor process that has to control the diffusion and the contour of doping material.

Referring to FIG. 1, a sectional view of an RTA equipment 100 is illustrated in FIG. 1. When using the RTA equipment 100 for a thermal annealing process, a wafer 104 first is loaded in a wafer loading 106, and the wafer loading 106 with the wafer 104 is then loaded into a reaction chamber 102. Thereafter, the reaction chamber 102 is heated by a heat source 108 to complete the RTA process. In general, a complete RTA process includes, but is not limited to, the following steps, in order: a hold temperature step, a first ramp up step, a stable temperature step, a second ramp up step, a RTA step and a cool down step. The monitoring of the temperature of the reaction chamber 102 is provided by a pyrometer 110 for measuring a thermal radiation of the reaction chamber 102 through a window 112, and the measured thermal radiation is transferred into a temperature of the reaction chamber 102. Then the temperature of the reaction chamber 102 is fedback to a control unit (not shown) of the RTA equipment 100 in order to control the RTA process described above.

However, during the RTA process described above, an instability of the pyrometer 110 may happen as a result of the wafer 104 being attached to the window 112 during the RTA process, or due to a failure of the pyrometer 110 itself. Thus the unstable pyrometer 110 may create an instability of a measured temperature of the RTA process, which, in turn, may disturb the RTA process and damage the wafer 104.

SUMMARY OF INVENTION

Accordingly, the purpose of the present invention is to provide a RTA process that is applicable for monitoring a stability of the RTA process during an initial stage of a RTA step.

Another object of the present invention is to provide an RTA process that is applicable for terminating a RTA step during the initial stage of the RTA step when an instability of the RTA process occurs in order to avoid failure of wafer.

In order to achieve the above objects and other advantages of the present invention, an RTA process is provided for an RTA equipment, in which the RTA equipment has a pyrometer for monitoring a temperature of the RTA process. The RTA process includes, but is not limited to, the following steps: proceeding a first RTA step to a wafer in the RTA equipment, comparing a measured value of an operation parameter with a reference range of value of the operation parameter; and proceeding a second RTA step to the wafer in the RTA equipment when the measured value of the operation parameter is in between the reference range of value of the operation parameter. When the measured value of the operation parameter is out of the reference range of value of the operation parameter, the RTA equipment is turned off in order to terminate the second RTA step.

Moreover, in the RTA process described above, the RTA process further comprises, but is not limited to, the following steps to the wafer before the first RTA step: a hold temperature step, a first ramp up step, a stable temperature step and a second ramp up step.

Moreover, in the RTA process described above, the RTA process further comprises, but is not limited to, a cool down step to the wafer after the second RTA step.

Moreover, in the RTA process described above, the RTA process further comprises, but is not limited to, unloading the wafer from the RTA equipment and loading the wafer into other RTA equipment after the previous RTA equipment is turned off, in order to complete the RTA process of the wafer.

Accordingly, in the RTA process described above, the RTA step includes, but is not limited to, a first RTA step, a second RTA step, a reference range of value of the operation parameter being set up in the second step. Therefore, the stability of the RTA process can be monitored by comparing the measured value of an operation parameter with a reference range of value of the operation parameter before the second RTA step proceeds.

Thereafter, in the RTA process described above, when the measured value of an operation parameter is out of the reference range of value of the operation parameter, the RTA equipment is turned off to terminate the proceeding of the second RTA step and to avoid damage to the wafer due to the instability of the RTA process.

Moreover, in the RTA process described above, when the RTA process is unstable, the wafer will not be damaged since the operation time of the first RTA step is shorter than the operation time of the second RTA step. After that the wafer is unloaded from the RTA equipment and loaded into other RTA equipment where the RTA process of the wafer is completed.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 2:
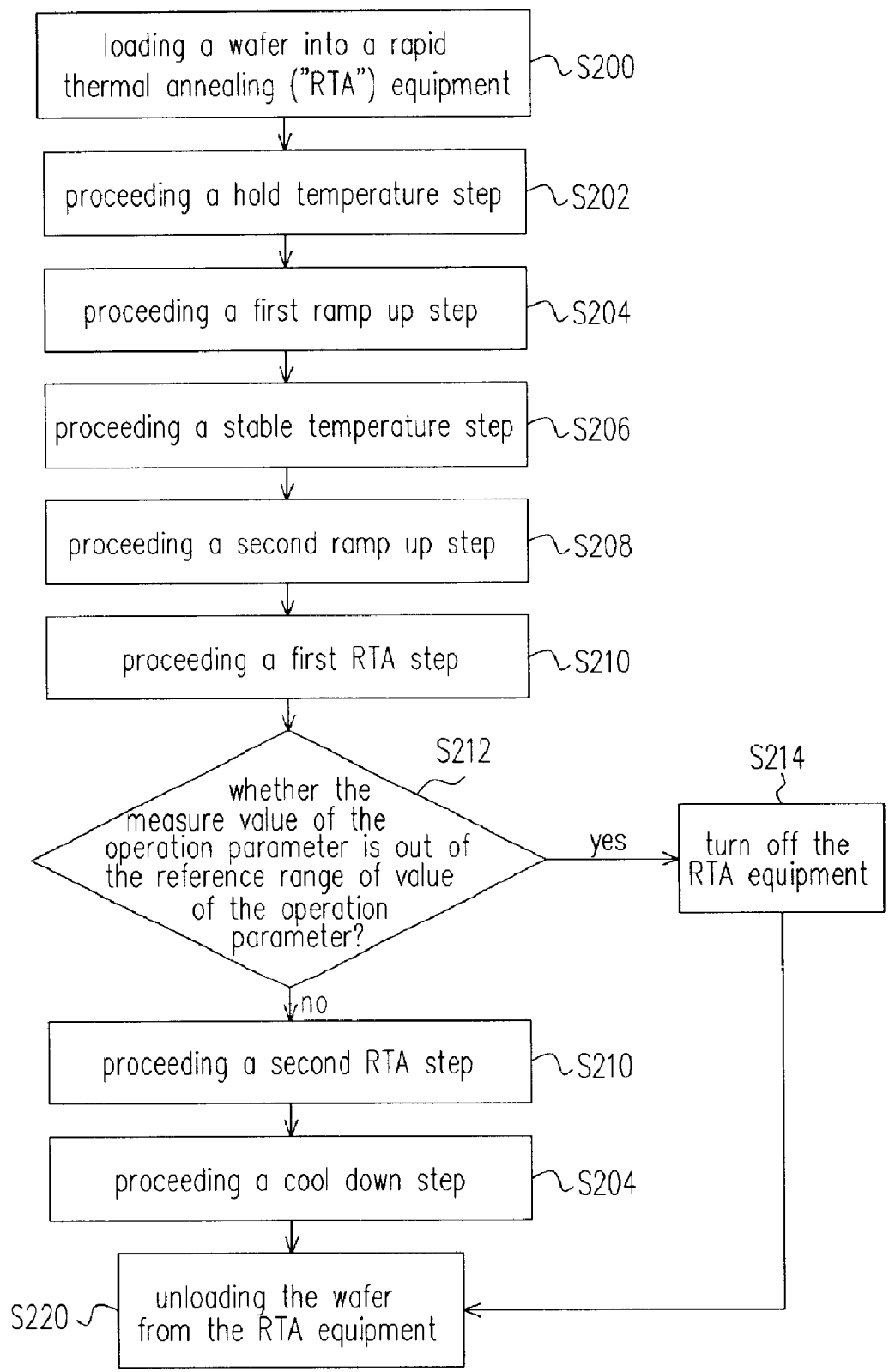
FIG. 2 is a process flow chart illustrating an RTA process of the preferred embodiment of the present invention.
Figure 3:
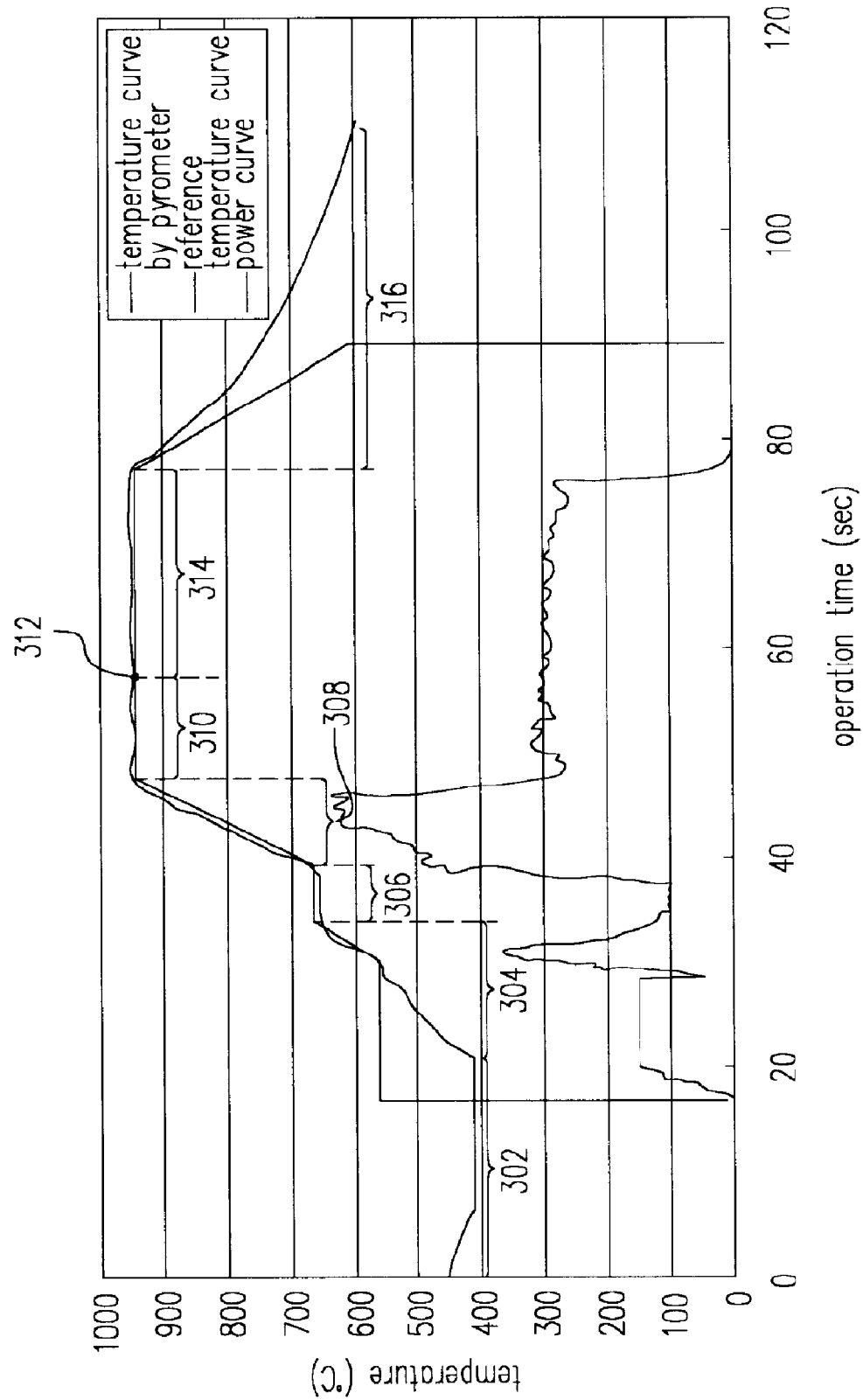
FIG. 3 illustrates a temperature curve corresponding to operation time of the RTA process of the preferred embodiment of the present invention.

Referring to FIG. 2 and FIG. 3 at the same time, FIG. 2 is a process flow chart illustrating an RTA process of a semiconductor wafer of the preferred embodiment of the present invention, and FIG. 3 illustrates a temperature curve corresponding to the operation time of the RTA process of a semiconductor wafer of the preferred embodiment of the present invention. The steps of the process flow shown in FIG. 2 are described in the following.

Figure 1:
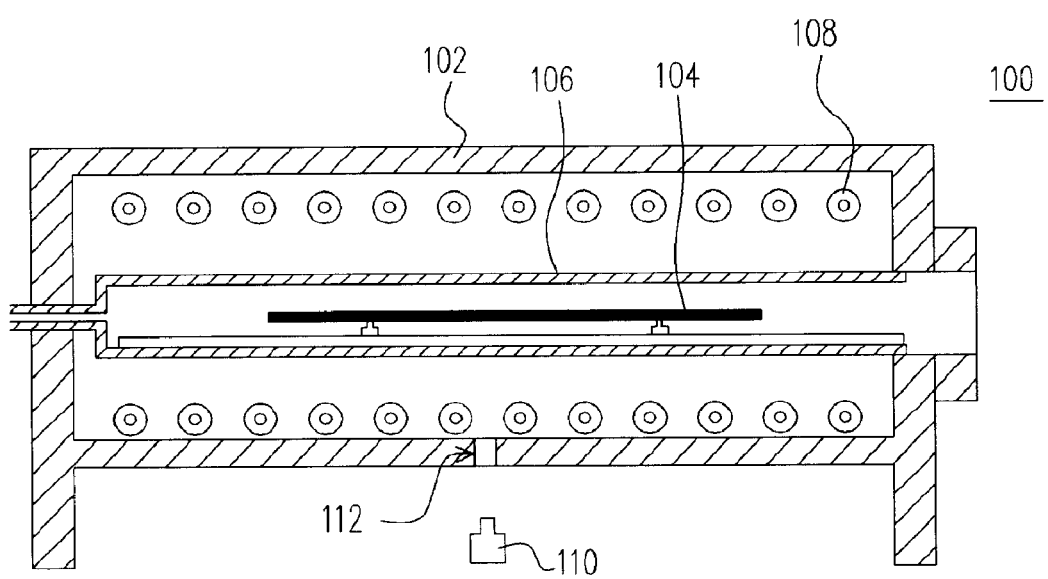
FIG. 1 a sectional view of an RTA equipment 100 of the preferred embodiment of the invention.

First of all, referring to Step S200 shown in FIG. 2, a wafer (not shown) is loaded into a reaction chamber of an RTA equipment (the model of the equipment is AST2800), in which the sectional view of the RTA equipment is the same as the diagram shown in FIG. 1. And an inner dielectric layer is formed on the wafer with material that includes, for example, but is not limited to, borophosphosilicate glass ("BPSG"), and a thermal flow is performed on the inner dielectric layer by the RTA process.

Thereafter, referring to Step S202 shown in FIG. 2 and FIG. 3 at the same time, a hold temperature step 302 proceeds in order to maintain the wafer in a constant temperature for some time in the reaction chamber. As shown in FIG. 3 of the preferred embodiment of the invention, a wafer is maintained at about 400° C. for about 20 seconds when the wafer is loaded into the reaction chamber.

Referring to Step S204 shown in FIG. 2 and FIG. 3 at the same time, a first ramp up step 304 proceeds in order to ramp the wafer temperature to another constant temperature. As shown in FIG. 3 of the preferred embodiment of the invention, the wafer is ramped from about 400° C. to about 650° C. during about 10 seconds in the first ramp up step 304.

Referring to Step S206 shown in FIG. 2 and FIG. 3 at the same time, a stable temperature step 306 proceeds in order to maintain the wafer at another constant temperature for some time in the reaction chamber. As shown in FIG. 3 of the preferred embodiment of the invention, the wafer is maintained at about 650° C. for about 5 seconds.

Referring to a Step S208 shown in FIG. 2 and FIG. 3 at the same time, a second ramp up step 308 proceeds in order to ramp the wafer temperature to another constant temperature. As shown in FIG. 3 of the preferred embodiment of the invention, the wafer is ramped from about 650° C. to about 950° C. during about 10 seconds in the second ramp up step 308.

Referring to a Step S210 shown in FIG. 2 and FIG. 3 at the same time, a first RTA step 310 proceeds in order to maintain the wafer temperature at another constant temperature in the reaction chamber. As shown in FIG. 3 the of preferred embodiment of the invention, the wafer is maintained at about 950° C. for about 10 seconds in the first RTA step 310.

Referring to Step S212 shown in FIG. 2 and FIG. 3 at the same time, an inspecting step 312 proceeds in order to determine whether a measured value of the operation parameter is in between the reference range of value of the operation parameter, in which the operation parameter includes, but is not limited to, a temperature measured by the pyrometer or a power provided by the RTA equipment. Thereafter the instability of the RTA process results from the instability of the operation parameter of the RTA equipment.

Moreover, referring to FIG. 3, a measured pyrometer temperature curve of a normal RTA process is illustrated in FIG. 3. In the normal RTA process, during the first RTA step 314 or a second RTA step 316, a variation of the measured pyrometer temperature curve or a variation of the measured power curve is very small or approaches zero, that is, the measured pyrometer temperature curve or the measured power curve approaches respectively a stable value. When the RTA process is unstable, the variation of the measured operation parameter curve will be very large, so the reference range of value of the operation parameter is predetermined by extending the measured value into a reference range of value in a normal RTA process. In a second RTA step of the preferred embodiment of the present invention, the measured temperature of a normal second RTA step by the pyrometer is about 950° C., so the reference range of value of the temperature parameter is set in a range of, but not limited to, about 950° C.±20° C. Thereafter, a measured temperature of a first RTA step by the pyrometer is compared to the reference range of value of the temperature parameter during a RTA process.

Referring to FIG. 2, when a measured temperature during a first RTA step by the pyrometer is in between the reference range of value of the temperature parameter, the RTA process is referred to as a stable process and a second RTA step 314 as shown in FIG. 3 proceeds. The second RTA step 314 is a second stage of the RTA step for maintaining the wafer at the main process temperature of the first RTA step. As shown in FIG. 3 of the preferred embodiment of the invention, the wafer is maintained at about 950° C. for about 20 seconds in the second RTA step 314.

Thereafter, referring to Step S218 shown in FIG. 2 and FIG. 3 at the same time, a cool down step 316 proceeds in order to cool down the temperature of the wafer to a predetermined temperature that includes, but is not limited to, the temperature of the reaction chamber when the wafer is loaded there. Thereafter, referring to Step S220 in FIG. 2, the wafer is unloaded from the reaction chamber to complete the RTA process.

Moreover, referring to Step S212 in FIG. 2 and the related Step 312 in FIG. 3, when a measured value of operation parameter is out of the reference range of value of the operation parameter, the RTA process is referred to as an unstable process and Step S214 in FIG. 2 proceeds to turn off the RTA equipment. Then Step S220 in FIG. 2 proceeds to unload the wafer from the reaction chamber. The wafer is not damaged by the unstable RTA process because the operation time of the first RTA step is short. Thus the wafer is loaded into another normal RTA equipment to complete the RTA process.

According to the embodiments described above, in general one of the advantages of the present invention is that the RTA step includes, but is not limited to, a first RTA step and a second RTA step, with reference range of value of the operation parameter being set up in the second step. Therefore, the stability of the RTA process can be monitored by comparing the measured value of an operation parameter with a reference range of value of the operation parameter before the second RTA step proceeds.

Moreover, another advantage of the present invention is that during the RTA process, when a measured value of an operation parameter is out of the reference range of value of the operation parameter, the RTA equipment is turned off to terminate the proceeding of the second RTA step avoiding damage to the wafer due to the instability of the RTA process.

Moreover, another advantage of the present invention is that during the RTA process, when the RTA process is unstable, the wafer will not be damaged because the operation time of the first RTA step is shorter than the operation time of the second RTA step. After the wafer is unloaded from the RTA equipment and loaded into another RTA equipment, the RTA process of the wafer is completed in another RTA equipment.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A rapid thermal annealing (RTA) process of a first RTA equipment, wherein the first RTA equipment has a pyrometer for measuring a temperature of the RTA process, the RTA process comprising the following steps:

loading a wafer into a reaction chamber of the first rapid thermal annealing ("RTA") equipment;

proceeding a hold temperature step to maintain the reaction chamber at a first temperature;

proceeding a first ramp up step to ramp up the first temperature to a second temperature of the reaction chamber;

proceeding a stable temperature step to maintain the reaction chamber at the second temperature;

proceeding a second ramp up step to ramp up the second temperature to a main process temperature of the reaction chamber;

processing a first RTA step by maintaining the reaction chamber at the main process temperature;

comparing a measured value of an operation parameter with a preset corresponding reference range of value of a normal RTA process; and proceeding a second RTA step by maintaining the reaction chamber at the main process temperature when the measured value of the operation parameter is within the corresponding reference range of value of the normal RTA process, wherein when the measured value of the operation parameter exceeds the preset corresponding reference range of value of the normal RTA process, the first RTA step is terminated without proceeding with the second RTA step; and proceeding a cool down step to cool down the main process temperature to the first temperature of the reaction chamber.

2. The RTA process of claim 1, further comprising transferring the wafer from the first RTA equipment into a second RTA equipment when the measured value of the operation parameter is out of range of the preset corresponding reference range of value of the normal RTA process to complete the RTA process of the wafer.

3. The RTA process of claim 1, wherein the operation parameter comprises a temperature, which is measured by the pyrometer.

4. The RTA process of claim 1, wherein the operation parameter comprises a power provided by the first RTA equipment.

5. The RTA process of claim 1, wherein further comprises an operation time of the first RTA step is shorter than an operation time of the second RTA step.

6. The RTA process of claim 1, wherein an operation temperature of the first RTA step and an operation temperature of the second RTA step are same.

* * * * *